(12) United States Patent
Lee et al.

(10) Patent No.: US 7,181,664 B2
(45) Date of Patent: Feb. 20, 2007

(54) METHOD ON SCAN CHAIN REORDERING FOR LOWERING VLSI POWER CONSUMPTION

(75) Inventors: Herng-Jer Lee, Tao-Yuan (TW); Chia-Ming Ho, Tao-Yuan (TW); Chia-Chi Chu, Tao-Yuan (TW); Wu-Shiung Feng, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 236 days.

(21) Appl. No.: 10/827,507

(22) Filed: Apr. 19, 2004

(65) Prior Publication Data
US 2005/0235182 A1    Oct. 20, 2005

(51) Int. Cl.
*G01R 31/28* (2006.01)
(52) U.S. Cl. ..................................... 714/726
(58) Field of Classification Search .............. 714/726, 714/727, 729, 738; 716/4, 5, 6
See application file for complete search history.

(56) References Cited

U.S. PATENT DOCUMENTS

| | | | |
|---|---|---|---|
| 6,272,668 B1 * | 8/2001 | Teene | 716/10 |
| 6,282,506 B1 * | 8/2001 | Takeoka et al. | 703/28 |
| 6,662,327 B1 * | 12/2003 | Rajski | 714/738 |
| 6,986,090 B2 * | 1/2006 | Hathaway et al. | 714/727 |
| 2004/0177299 A1 * | 9/2004 | Wang et al. | 714/726 |
| 2005/0010832 A1 * | 1/2005 | Caswell et al. | 713/330 |

* cited by examiner

*Primary Examiner*—James C Kerveros
(74) *Attorney, Agent, or Firm*—Alan D. Kamrath; Nikolai & Mersereau, P.A.

(57) ABSTRACT

A method for reordering a scan chain meets given constraints and minimizes peak power dissipation. The given constraints include a maximum peak power dissipation, a maximum scan chain length and a maximum distance between two successive registers. The method includes embedding a developed tool into an existing VLSI design flow for low-power circuit designs. Furthermore, the characteristics quickly judge if the problem has corresponding feasible solutions and searching the optimal solution. Modified data from the given scan chain declaration data and the scan pattern data, which satisfy the constraints, can be obtained.

6 Claims, 6 Drawing Sheets

|       | Input |   |   |   | A | B | C | D | Output |
|-------|---|---|---|---|---|---|---|---|---|
| Shift |   |   |   |   |   |   |   |   |   |
| (0)   | 0 | 1 | 0 | 1 | 0 | 0 | 0 | 0 |   |
| (1)   | x | 0 | 1 | 0 | 1 | 0 | 0 | 0 |   |
| (2)   | x | 0 | 1 | 0 | 1 | 0 | 0 | 0 |   |
| (3)   | x | x | x | 0 | 1 | 0 | 1 | 0 |   |
| (4)   | x | x | x | x | 0 | 1 | 0 | 1 |   |

FIG.1A
PRIOR ART

|  |  | Input |  |  |  | Output |  |  |
|---|---|---|---|---|---|---|---|---|
| Shift |  |  |  |  | B | D | A | C |
| (0) | 1 | 1 | 0 | 0 | 0 | 0 | 0 | 0 |
| (1) | x | 1 | 1 | 0 | 0 | 0 | 0 | 0 |
| (2) | x | x | 1 | 1 | 0 | 0 | 0 | 0 |
| (3) | x | x | x | 1 | 1 | 0 | 0 | 0 |
| (4) | x | x | x | x | 1 | 1 | 0 | 0 |

FIG.1B
PRIOR ART

METHOD ON SCAN CHAIN REORDERING FOR LOWERING VLSI POWER CONSUMPTION

BACKGROUND OF THE INVENTION

1. Field of the Invention

This invention relates to a method for reordering a scan chain and, more particular, to a method for reordering a scan chain that minimizes the peak power consumption of Very Large Scale Integration (VLSI) Circuits.

2. Description of Related Art

Along with VLSI Circuits designed to be more complex, higher density transistors and lower power consumption components are used widely. Designing a lower power consumption VLSI circuit is the latest trend.

In recent years, a topic for discussion of the Design for Testability (DFT) of VLSI circuits against the power dissipation has been widely regarded. A general designed circuit is operated in two modes: Normal Mode and Test Mode. In the test mode, the test patterns for testing combinatory logic circuits are stored in the scan register of the system. Some of the test patterns may not appear in the normal mode at all. In other words, the potential conversion of the register may not happen in the normal mode and possibly may happen in the test mode. Therefore, the test pattern in the test mode will lead to high power dissipation in the circuit of the register. In another aspect, the test pattern is generated by an Automatic Test Pattern Generator (ATPG) that is designed with DFT and will test the majority of circuits as it possibly can and make the potential of the circuits frequently convert, thereby causing the condition circuit to be more deteriorated.

It is noteworthy that an oversized peak value of power dissipation will lead to a malfunction of the circuit during testing. Namely, a chip normally operating in the normal mode may not be qualified by ATPG. There are various ways of improvement of reducing the power dissipation in the testing mode. Some conventional technologies (R. M. Chou, K. K. Saluja, and V. D. Agrawal, "Scheduling tests for VLSI systems under power constraints," IEEE Trans. VLSI, vol. 5, no. 2, pp. 175–184, 1997 and S. Wang and S. K. Gupta, "ATPG for heat dissipation minimization during test application," in Proc. IEEE mt. Test Conf., 1994, pp. 250–257) are used ATPG to create the optimum test patterns capable of reducing the power dissipation.

Further, re-ordering the Scan Chain register can also effectively reduce the power dissipation at the time of the potential conversion. As shown in FIG. 1A, if the test pattern data, 0101, is input to a 4-bit scan chain, ABCD, then 10 times of the potential state conversion occur in the course of 4 times of shift wherein the potential state conversion of each bit occurs in the case of the last shift. If the re-ordered scan chain is BDAC, as shown in FIG. 1B, only 2 times of potential state conversion occur in the course of 4 times of shifts. A conventional technology (V Dabholkar, S. Chakravarty, I. Pomeranz, and S. Reddy, "Techniques far minimizing power dissipation in scan and combinational circuits during test application," IEEE Trans. CAD, vol. 17, no. 12, pp. 1325–1333, 1998) provides two algorithms: Random Ordering and Simulated Annealing. However, if there is much test pattern data and there are large amounts of registers, ordering of a large number of registers is necessary so as to highly reduce the power dissipation as much as possible, thereby causing uneconomical situations. However, simulated annealing an initial state that is possibly close to minimum power dissipation (otherwise it may take long time to perform the algorithm) is not practical. Regarding this problem, this invention provides research on scan chain ordering that quickly meets the limits of design specifications. Also, still another conventional technology (O. Sinanoglu, I. Bayraktaroglu, and A. Orailoglu, "Scan power reduction through test data transition frequency analysis," in Proc. Int. Test Conf, 2002, pp. 844–850) is provided to insert an inverter into the parts of the positions of the scan chain, thereby reducing the probability of the potential conversion for a reduction of power dissipation. However, the insertion of the inverter will change the circuit placement formerly completed in the physical design of the VLSI circuit, so that this practice is not involved in the research field of this invention. Next, another conventional technology (S. Ghosh, S. Basu, and N. A. Touba, "Joint minimization of power and area in scan testing by scan cell reordering," in Proc. IEEE Computer Society Annual Symposium on VLSI, 2003, pp.) seeks for an optimum scan chain ordering using a Greedy Algorithm and considers the connection distance between the power dissipation and the registers. Supposing that the coordinates of the two registers are (x1, y1) and (x2, y2), respectively, $|x1-x2|+|y1-y2|$ is given for a Manhattan Distance between the two registers.

In addition to the two conditions, as mentioned above, the limitations of the total connection length of the scan chain, namely, the total length of distance between registers, is considered. Again, seeing from the technologies hereinbefore, a fixed value is given for the power dissipation of each of the two registers in the scan chain and, hence, to reduce the peak value of the power dissipation by cutting down the number of times of the potential state conversion. It is considered in the present invention that the practical power dissipation value of the register is not fixed, so that a small number of times of potential state conversion will not necessarily mean a small power dissipation.

SUMMARY OF THE INVENTION

The test pattern data is in a proper order input from the outside of the scan chain into the inside of each of the registers for testing the combinatory logic circuit. When an N-class register is included in a scan chain, the test pattern data must pass through a N clock period to shift its value in a proper order and to store the test pattern data in a corresponding one of the registers. In this process, the shift may cause power dissipation when one of the states, 0-1 or 1-0, of the shift registers is changed.

This method of the present invention is to re-order the corresponding positions of each of the registers on the scan chain for reduction of the peak power dissipation. The algorithm tool according to the present invention not only can match with the current design flow for the VLSI circuit to quickly determine the proper order of the rebisters on the scan chain, but also can meet the following design conditions:(1) a peak value of power dissipation at a potential conversion of the register, (2) the maximum value of a total connection length of the scan chain, and (3) the maximum value of a connection distance between two adjacent registers. The scan chain buffer data and the test pattern data are input, and the ordered scan chain buffer data and the test pattern data that meet all cinditions are output.

BRIEF DESCRIPTION OF THE DRAWINGS

FIG. 1A shows a simple embodiment illustrating a scan chain before being arranged;

FIG. 1B shows a simple embodiment illustrating a scan chain after being arranged;

DETAILED DESCRIPTION OF THE PREFERRED EMBODIMENT

Figure 2:
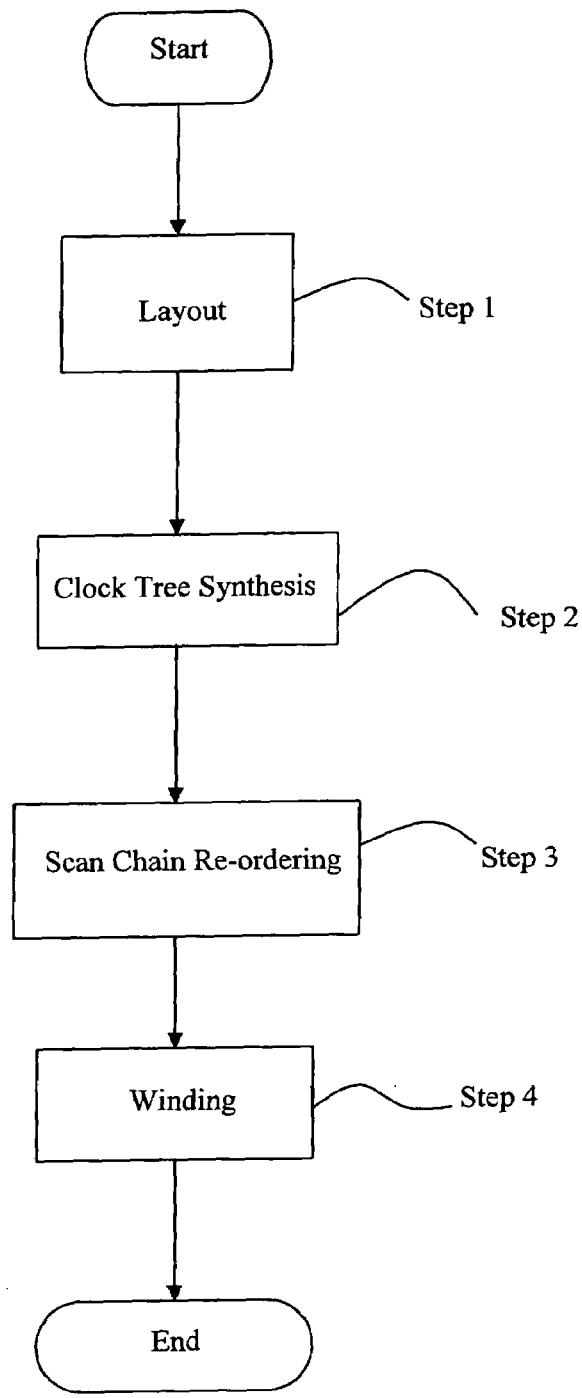
FIG. 2 shows an IC design and layout flow chart according to a conventional technology.

FIG. 2 shows an IC design and layout flow chart according to a conventional technology. Step 1 for layout and step 4 for winding are the traditional IC layout steps, wherein timing and noise optimization can be considered together. At step 2, Clock Tree Synthesis is performed to meet Clock Delay and Clock Skew. Next, at step 3, the scan chain re-ordering ordering is performed. At this time, layout for all circuits is completed, the scan chain registers are arranged in order according to design specification, and the final winding is performed.

Figure 3A:
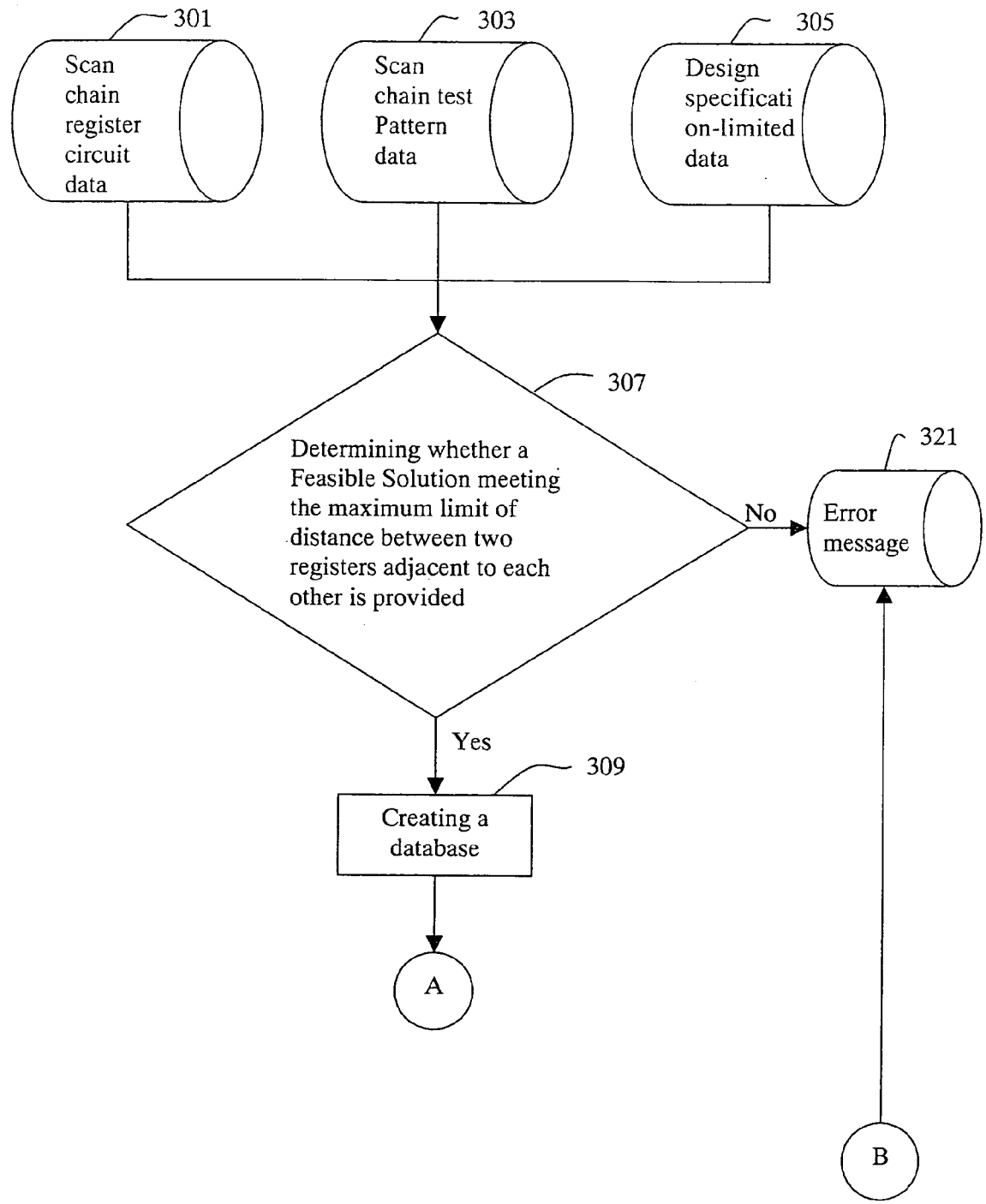
FIGS. 3A and 3B show I/O block diagram of an algorithm tool according to a particular embodiment of the present invention.
Figure 3B:
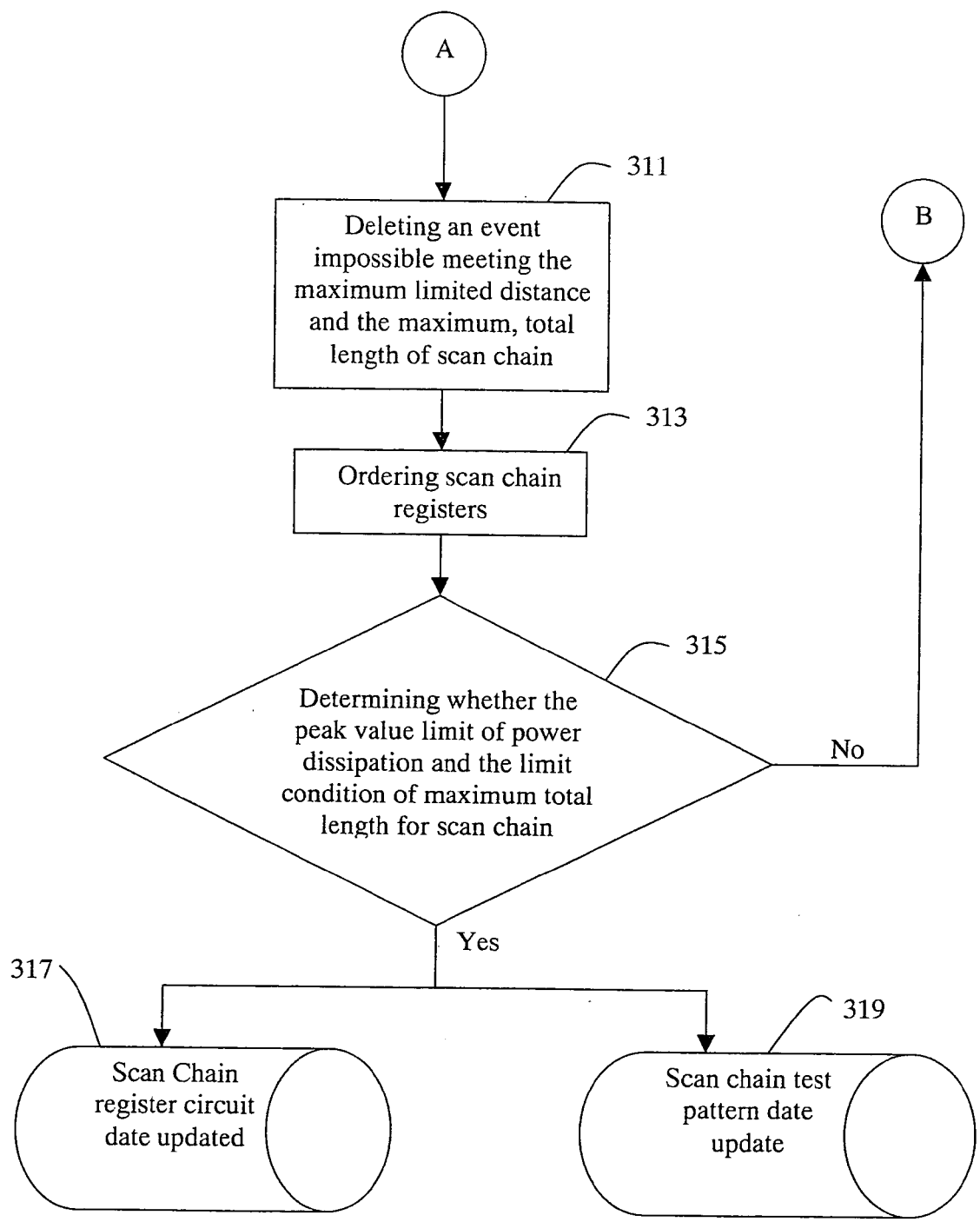

FIGS. 3A and 3B show shows an I/O block diagram of an algorithm tool according to a particular embodiment in accordance with the present invention. The scan chain register circuit data 301 defines the name of each of the registers, the 2D coordinates, and the power dissipation value. The 2D coordinates can provide the Manhattan distance for an algorithm. After input of a unit of test pattern data and every time a shift is made, the total power dissipation of the registers of which the potential is converted and calculated until the test pattern shift stops, and, then, the peak value of power dissipation is gained. In the test pattern data 303 of the scan chain, if an M-unit of the test pattern data is provided, the maximum is picked again from the peak values of the corresponding M-unit power dissipation.

For simplicity, it is supposed in the present invention that (1) the defaults of the potential state of each of the registers are 0 before a first unit of the test pattern data is input, and (2) after the former unit of the test pattern data is completely shifted and output, the values of each of the registers are equal to those of the registers at the input of the scan chain. At this time, another unit of new test pattern data is input. We assume that an algorithm of the power dissipation is performed only when the potential conversion occurs in the scan chain. Three limited conditions are set in the design specification for data 305: (1) the peaking value of the power dissipation at the time of potential conversion of register, (2) the maximum of the total connection length of the scan chain, and (3) the maximum of a connection distance between two adjacent registers.

Generally speaking, the Exhaustive Search easily obtains an optimal solution, Specifically, all registers are sequentially arranged, and a unit of the optimal arrangement order is found to meet all the limited conditions. However, the main disadvantages are as follows. First N! type(s) of arrangements are provided for N unit(s) of registers, and the maximum power dissipation must be compared with each arrangement. Thus the algorithm is very complicated. Second if there is no feasible solution that meets the limited condition(s), the determination is not made until the N! type(s) of the arrangement(s) is/are implemented.

Regarding the problem as described above, the developed algorithm tool according to the present invention provides the prompt determination of a feasible solution, and quickly and effectively searches for an optimal solution. The main step of the algorithm tool includes three items as follows:

1. According to the maximum limited distance between the two adjacent registers, first at step 307, in FIG. 3A, it is determined whether a Feasible Solution meeting the limit condition is provided. If any exists, at step 307, in FIG. 3A, each register adjacent to a register is searched, and a database is built to store the information at step 309. If none exists, no feasible solution 321 meeting the condition is provided;

2. If an event 311 impossibly meets the maximum limited distance and the maximum, the total length of the scan chain is ignored; and 3. For the given test pattern, the arrangement order 313 of the register on the scan chain is made for a reduction of the peak value of the power dissipation. Also, it is determined whether the peak value limit of the power dissipation and the limit condition 315 of the maximum total length for the scan chain connection accords. If the determination is yes, the updated scan chain arrangement 317 and the corresponding scan chain test pattern data 319 are output. If the determination is no, no feasible solution 321 meeting the limit condition of design is provided.

The present invention will be described in more detail hereinafter.

Establishment of a Database of Registers Adjacent to Each Other

A memory space is used to build a register database that meets the maximum distance between two registers adjacent to each other. In the course of arrangement of each of the registers, the registers possibly adjacent to each other are determined according to the limit condition. If there are a large number of registers in the scan chain, it takes much time in a one-by-one search. Therefore, it is required to pre-build a group database of registers adjacent to each other. At the time of the arrangement, the search field can be narrowed, thereby saving much time in the search.

Figure 4:
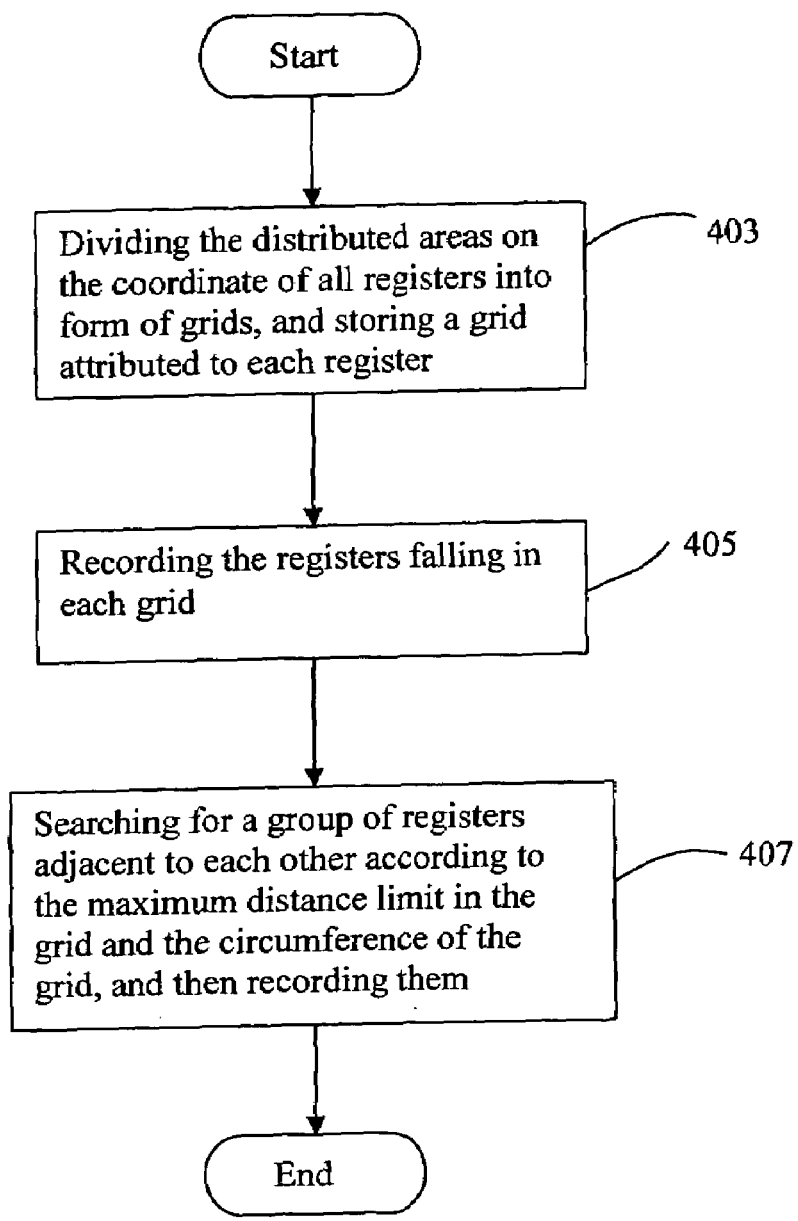
FIG. 4 shows a flow chart explaining a database of registers adjacent to each other according to the present invention.

To effectively build a database, the following three stages will pass in the processes, as shown in FIG. 4.

1. The distributed areas on the coordinates of all registers are divided into the form of a grid, and a grid 403 attributed to each register is stored, with D representing the maximum limit of the distance between two registers that are adjacent to each other. The distributed areas of registers are divided into grids of 2D in length and width. When a scan chain register file is read, the coordinates of each of the registers are saved at the same time. In addition, the positions of each of the registers in the grid are unnecessarily fixed in the center so that the two adjacent registers are possibly in the circumference of the grid and their coordinates must also be saved. For example, in the case of D=5, if the register coordinates are (37, 52), then the register stays in a grid (4, 6). Said register stays at the lower right-hand corner, so the corresponding adjacent registers will be in grids (5, 6), (4, 5), and (5, 5);

2. A register 405 falling in each grid is recorded; and

3. An adjacent registers group 407 according to the maximum distance limit in the grid and in the circumference of the grid is found and recorded.

However, if the maximum limit of the distance between the two adjacent registers is exceeded, it is not proper to build such a database for a search request. The higher maximum limit of distance is required, more registers adjacent to each other are employed, and also more data must be stored. Thus more data is searched, and more time is taken. Consequently, in the condition of an invalid search, the memory space is wasted without any reason. Hereby, in order to solve this problem, in the present invention based on the statistics, only when the amount of the grid is larger than or equal to 9 (grids), a database of the adjacent registers is built. When the amount of grid is smaller than 9 (grids), a search in an entire area will be made.

For an Event Impossibly Meeting the Maximum Limited Distance and the Maximum, the Total Length of the Scan Chain is Ignored.

First, an event impossibly meeting the maximum limit of distance is considered. According to the database of the adjacent registers that is built in the former step, the following particular situations can be concluded.

Existence in a register without any corresponding group of the adjacent registers indicates that the design is provided with no feasible solution. Existence in a register with only an adjacent register indicates that the register must be the output terminal of this scan chain, and its adjacent register is second in arrangement order.

Existence in two registers with only an adjacent register for both of the two adjacent registers indicates no feasible solution. For example, if the register A1 is adjacent to the register A, then the register B1 is adjacent to the register B. If A is B1, then, it is inferred that A1 is B. Except for A and B, no registers are adjacent so that no solution is given.

Two registers are different from each other indicates that one register can be made as the input of the scan chain, arid the other as the output.

At least four registers with only an adjacent register indicates that no feasible solution is given. Except for the I/O terminals of the scan chain, no places allow the register, so no feasible solution is given.

Next, for the event not meeting the maximum, the total length limit of the scan chain is ignored. At this step, the best case and the worst case are respectively estimated for the scan chain length. Regarding any of the registers I, the distance $D_i^{min}$ closer to the other registers, the distance $D_i^{max}$ further from the other registers, and the distance $D_i^{avg}$ equidistant from the other registers are estimated. If $L_{min} = _i D_i^{min}$, $L^{max}, = \Sigma_i D_i^{max}$, and $L^{avg} = \Sigma_i D_i^{avg}$ are made, then through the estimation, the scan chain length is given $L^{min}$ for the best case, while the scan chain length is given $L^{max}$ for the worst case. The actual scan chain length is not probably $L^{min}$ or $L^{max}$, but the length falls within the two margins, so that a judgment can be made between the two margins. It is assigned that the total limit of the length of the maximum scan chain is $L_{lim}$ and the two lengths are compared with each other for estimation, and, then, a conclusion is made as follows:

$L_{lim} < L^{min}$: no feasible solution given;

$L^{min} <= L_{lim} < L^{max}$: at the time of the arrangement of the scan chain registers at a next step, in addition to a search for a combination of the peak values in the adjacent registers so as to reduce power dissipation, a case beyond the total limit of the length of the maximum scan chain also being taken into consideration so that registers must be arranged to shorten the scan chain on the occasion; and $L^{min} < L_{max}$: at the time of arrangement of the scan chain registers at a next step, the total limit of length of the maximum scan chain not being taken into consideration but a search is made of a set of peak values in the adjacent registers to reduce power dissipation.

Arrangement of the Registers on the Scan Chain

When the shift of a test pattern on the scan chain is observed, it can be found that the closer the register is to the output of the scan chain, the more groups of the shift registers of the opposite test pattern will pass by. Thus, the state conversion of register 0-1 or 1-0 may be caused many times in the course of the shift. In the algorithm tool according to the present invention, registers at the output of the scan chain are in advance set, and then the registers are recursively arranged in order towards the input terminal. The point is to decide a next optimal register to be arranged at an optimal register of the output terminal.

A peak value of the power dissipation is not given in the calculation until the registers on the entire scan chain are fully arranged. Also, the calculation is enormous so that an actual value of the power dissipation cannot be given in the course of a recursive arrangement. In the aspect of the reduction of the power dissipation peak, it is expected in the method of the present invention that the number of times of the register state conversion caused in the period of shift is reduced, which is a concept on the statistics for an average in order to avoid an enormous peak value of the power dissipation at the time of huge state conversion. In order to reduce the calculation loading at the same time, the algorithm tool according to the present invention uses a logical XOR calculation to every time sort out a next optimal register in a set of registers having not been arranged in the course of arrangement so that the opposite test patterns can be a little different from the test patterns of the registers so far having been arranged, thereby reducing the probability of register state conversion in each shift.

For example, the test patterns with respect to A, B, C, and D are listed below, and it is assumed that A has been arranged.

| A | B | C | D |
|---|---|---|---|
| 0 | 1 | 0 | 1 |
| 1 | 0 | 1 | 1 |
| 1 | 1 | 0 | 0 |
| 0 | 1 | 0 | 1 |
| 1 | 0 | 1 | 0 |

First, B, C, and D respectively corresponding to A are calculated through XOR, and the minimum is used as an adjacent register of A. In case of XOR(B,A)=4, XOR(C,A)=1, and XOR(D,A)=4, C is adjacent to A. Next, B and C respectively corresponding to C are calculated through XOR, and the minimum is used as an adjacent register of C; in case of XOR(B,C)=5 and XOR(D,C)=2, D is adjacent to C, and B is the last one remaining. Thus, BDCA is the arrangement in order made from the input to the output on the scan chain.

Then, a selection of a register at the output terminal is considered. The test pattern opposite to the register at the output will continuously affect the state conversion of each of the shift registers and the arrangement of the scan chain. However, generally speaking, they cannot be tested one by one for a suitable register at the output. Hereon, some experiences are used to help in judgment.

According to the last step, the special case of the built adjacent register database is used so that a register exists with an adjacent register only, and two registers exist, respectively, with an adjacent register only and the two registers are different from their adjacent registers.

If no special conditions occurred, the minority of the adjacent registers among all registers is used as the registers at the output. Thus, in that, the register cannot find an adjacent register in the scan chain is reduced, thereby facilitating the algorithm in time saving.

No provision of an adjacent register database indicates that there is no strict limit of the maximum distance between the adjacent registers, and thus the probability that the register cannot find any adjacent register in the scan chain is lower. At this time, of all registers, a register of the maximum power dissipation is used as an output terminal, and that register less different from the test pattern is used as an input terminal, thereby effectively lowering the impact of the register of maximum power dissipation to the peak value of power dissipation through full design.

Other Special Cases

Some special cases happening in the foregoing algorithm cannot be solved, so that the conclusion is made below.

Ordering of the registers on the scan chain simply through the reduction of the peak value of the power dissipation only may be contrary to the limit of the maximum scan chain length. To solve the problem, the time for the algorithm tool to order the scan chain must be determined best of all through shortening of the distance to the registers for conformability with the limit of maximum length. In the preferred embodiment of the present invention, an experience is used for estimation.

After the registers being arranged each time through the results given from the algorithm with XOR, the remaining length compared with the maximum length is estimated, the number of registers not arranged is divided, and finally, an average remaining distance is given.

Next, estimation of the margin around the average remaining distance is considered. The average estimation of the two proximal distance $D^{min}=L^{min}/\Sigma_i i$ is ideal, while average estimation of the averaged distance $D^{avg}=L_{avg}/\Sigma_i i$ is actual. Thus, the minimum between $10*D^{min}$ and $(D^{min}+D^{avg})/2$ is taken in the method of the present invention for estimation. Once the averaged remaining distance is less than the estimative value, the next registers are arranged very adjacent to each other.

A case that the registers not arranged existing in any of the registers not found adjacent intuitionally replace with another register. If no other registers exist, it is known that the arrangement of the former one register or several registers arranged is not proper, thus, the sequence of the scan chain registers formerly have been arranged must be again considered like DFS or Branch-and-Bound. However, in this estimation, the algorithm loading and the memory space required are too large to deal with a scan chain with a great lot of registers. Thus, for fear of no adjacent registers not arranged, in addition to a next register selected through XOR, a register adjacent to maximum registers not arranged must be found and recorded.

In short, in the present invention, a method of reordering a scan chain for the design of testability on a VLSI with low power dissipation is provided to work with the current design flow for the VLSI, to promptly determine the sequence of registers on a suitable scan chain, and to meet three limited conditions in the design specification: (1) the peak value of power dissipation at the time of potential conversion of register, (2) the maximum of total connection length of the scan chain and (3) the maximum of connection distance between adjacent two registers. The main steps of performing the algorithm tool in accordance with the present invention include: to determine whether a Feasible Solution meeting the maximum limit of distance between the two registers adjacent to each other being provided. If a Feasible Solution exists, a database of registers adjacent to each other is built. If no Feasible Solution exists, no feasible solution meeting the limit condition of design is provided. An event impossibly meeting the maximum limited distance and the maximum and the total length of the scan chain is ignored. For the given test pattern, the registers on the scan chain are reordered, and it is determined whether the peak value limit of power dissipation and the limit condition of maximum total length for the scan chain connection accord. With a positive determination, the updated scan chain arrangement and the corresponding scan chain test pattern data are output. With a negative determination, no feasible solution meeting the limit condition of design is provided.

As described above, only operational principles are given that do not limit the present invention. Although the invention has been explained in relation to its preferred embodiment, it is to be understood that many other possible modifications and variations can be made without departing from the spirit and scope of the invention as hereinafter claimed.

What is claimed is:

1. A method of reordering a scan chain for design of testability on VLSI with low power dissipation, comprising:
    (a) inputting scan chain register circuit data, including a name of each register, 2D coordinates, and power dissipation value(s);
    (b) inputting test pattern data on the scan chain;
    (c) inputting conditions of design specification including peak value of power dissipation at a time of potential conversion of register; maximum of total connection length of the scan chain; and maximum of connection distance between two adjacent registers;
    (d) determining whether a Feasible Solution meeting the maximum of connection distance between the two adjacent registers is provided;
    (e) creating a database of the two adjacent registers;
    (f) if an event meeting both the maximum of the total connection length and the maximum of connection distance, the total length of the scan chain being ignored;
    (g) for a given test pattern, re-ordering the registers on the scan chain for reduction of power dissipation, and whether determining peak value limit of power dissipation and the maximum of total connection length for the scan chain accord; and
    (h) outputting an updated scan chain arrangement and a corresponding scan chain test pattern data, wherein the event meeting the maximum of the total connection length of the scan chain is ignored in case of:
        (a) $L_{lim}<L^{min}$: no feasible solution given;
        (b) $L^{min}<=L_{lim}<L^{max}$: at the time of the arrangement of the scan chain register at a next step, in addition to a search for a combination of the peak values in the adjacent registers so as to reduce power dissipation, a case beyond the total limit of length of the maximum scan chain also being taken into consideration so that the registers must be arranged to shorten the scan chain on the occasion; and
        (c) $L_{lim}<L^{max}$: at the time of arrangement of the scan chain registers at a next step, the total limit of length of the maximum scan chain not being taken into consideration but a search for a set of peak values in the adjacent registers to reduce power dissipation; wherein i stands for any of the registers, and the distance $D_i^{min}$ indicates the distance of a register i closer to the other registers, the distance $D_i^{max}$ indicates the distance of a register i further from the other registers, and the distance $D_i^{avg}$ indicates the distance of a register i equidistant from the other registers are estimated, namely $L^{min}=\Sigma_i D_i^{min}$, $L^{max}=,\Sigma_i D_i^{max}$, and $L^{avg}=\Sigma_i D_i^{avg}$.

2. The method as claimed in claim 1, wherein creating the database of the two adjacent registers includes:

(a) dividing distributed areas on coordinates of all registers into a form of grids, and storing a grid attributed to each register;
(b) recording a register falling in each grid; and
(c) searching for and recording a group of the two adjacent registers according to the maximum of connection distance in the grid and in a circumference of the grid.

3. The method as claimed in claim 1, wherein the event meeting both the maximum of the connection length and the maximum limited distance of connection is ignored in case of:
(a) existence in a register without any corresponding group of the two adjacent registers which indicates that the design is provided with no feasible solution;
(b) existence in a register with only an adjacent register which indicates that the register must be the output terminal of the scan chain, and the adjacent register is second in arrangement order;
(c) existence in two registers with only an adjacent register:
  i. both of the two adjacent registers which indicates that no feasible solution is given; and
  ii. two registers different from each other which indicates that one register can be made to be an input terminal of the scan chain, and the other, to be an output terminal; and
(d) at least four registers with only an adjacent register which indicates that no feasible solution is given.

4. The method of reordering a scan chain for the design of testability on VLSI with low power dissipation as claimed in claim 3, wherein the scan chain registers are reordered to:
(a) decide a next optimal register to be arranged; and
(b) decide an optimal register of the output terminal.

5. The method of reordering a scan chain for the design of testability on VLSI with low power dissipation as claimed in claim 4, further comprising:
using a logical XOR calculation every time to sort out a next optimal register in a set of registers having not been arranged in the course of arrangement so that the opposite test patterns can be little different from the test patterns of registers so far having been arranged, thereby reducing the probability of register state conversion in each shift.

6. The method of reordering a scan chain for the design of testability on VLSI with low power dissipation as claimed in claim 3, wherein in order to decide an optimal register of the output terminal after the scan chain registers reordered includes:
(a) the special case of the built database of registers adjacent to each other occurs when (1) a register exists with an adjacent register only; and (2) two registers exist respectively with an adjacent register only, and the two registers are different from their adjacent registers;
(b) when no special cases occur, the minority of adjacent registers among all registers is used as the registers at the output; and
(c) when a database of registers adjacent to each other is provided, of all registers, a register of maximum power dissipation is used as the output terminal, and that less different from the test pattern is used as the input terminal.

* * * * *